United States Patent
Arai et al.

(10) Patent No.: US 6,320,470 B1
(45) Date of Patent: Nov. 20, 2001

(54) PHASE LOCK LOOP CIRCUIT WITH LOOP FILTER HAVING RESISTANCE AND CAPACITANCE ADJUSTMENT

(75) Inventors: Kenji Arai; Tomonobu Yokoyama, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/517,290

(22) Filed: Mar. 2, 2000

(30) Foreign Application Priority Data

Apr. 6, 1999 (JP) .................................................. 11-98330

(51) Int. Cl.[7] .................................................. H03L 7/085
(52) U.S. Cl. ............................ 331/17; 327/157; 327/112; 327/536
(58) Field of Search .............................. 331/17; 327/536, 327/112, 157

(56) References Cited

U.S. PATENT DOCUMENTS 5,646,563 * 7/1997 Kuo ........................................ 327/157
6,111,469 * 8/2000 Adachi ................................... 331/17

* cited by examiner

Primary Examiner—Arnold Kinkead
(74) Attorney, Agent, or Firm—Venable; Norman N. Kunitz

(57) ABSTRACT

In a LPF (loop filter) 10A, a reference voltage VR achieved through voltage division at resistors 21 and 22 is supplied to the gate of an NMOS 20 to cause a specific level of electrical current to flow into a PMOS 19 and the NMOS 20. The gate voltages at the PMOS 19 and the NMOS 20 are supplied to the gates of a PMOS 17 and an NMOS 18 constituting a current mirror circuit as bias voltages VP and VN. When a detection signal UP or DN is output from a PFD (phase difference detection circuit) 1, the PMOS 17 or the NMOS 18 functions as a high resistance component achieving a high degree of accuracy. The output from a lag lead filter constituted of the on resistances of the PMOS 17 and the NMOS 18, a resistor 15 and a capacitor 16 is provided to a VCO (voltage controlled oscillator circuit) 2 as a control voltage VC, which in turn generates an oscillation signal FV having specific response characteristics.

19 Claims, 7 Drawing Sheets

PHASE LOCK LOOP CIRCUIT WITH LOOP FILTER HAVING RESISTANCE AND CAPACITANCE ADJUSTMENT

BACKGROUND OF THE INVENTION

1. Field of the Invention

The present invention relates to a phase lock loop circuit (hereafter referred to as a "PLL") formed on an integrated circuit, and more specifically, it relates to a loop filter (hereafter referred to as an "LPF") thereof.

2. Description of the Related Art

A PLL is a circuit that causes the phase of an output signal from an oscillator to conform to the phase of a reference signal provided from the outside. PLLs are employed in a wide range of applications including frequency synthesizers that generate a signal at an arbitrary frequency based upon the frequency of a reference signal and a clock reproduction circuit that extracts a synchronous clock signal from a data signal.

FIG. 2 is a block diagram of a PLL in the prior art.

This PLL comprises a phase difference detection circuit (hereafter referred to as a "PFD") 1, a voltage controlled oscillator circuit (hereafter referred to as "VCO") 2, a feedback circuit 3 and an LPF 10.

The PFD1 detects the difference between the phases of a reference signal FR and an internal signal FI, and it outputs a detection signal UP by setting the level of the corresponding signal to "L" if the phase of the internal signal FI is retarded relative to the reference signal FR, whereas it outputs a detection signal DN by setting the level of the corresponding signal to "L" if the phase of the internal signal FI is advanced relative to that of the reference signal FR, shifting the phase to a degree corresponding to the length of time that represents the phase difference. If there is no phase difference, the PFD 1 outputs detection signals UP and DN with their levels set to "H."

The LPF 10 generates a stable control voltage VC, which corresponds to the phase difference by suppressing the high frequency component of the detection signal UP or DN. The LPF 10 is provided with a P-channel MOS transistor (hereafter referred to as a "PMOS") 11, connected between a source potential VDD and a node N1 on which ON/OFF control is implemented by the detection signal UP provided by the PFD 1. In addition, the LPF 10 is provided with an inverter 12 that inverts the level of the detection signal DN and an N-channel MOS transistor (hereafter referred to as an "NMOS") 13, which is connected between a ground potential GND and a node N1 and whose ON/OFF state is controlled by an output signal from the inverter 12. One end of a resistor 14 is connected to the node N1, with the other end of the resistor 14 connected to a node N2. A resistor 15 and a capacitor 16, which are connected in series, are connected between the node N2 and the ground potential GND, and the resistors 14 and 15 and the capacitor 16 constitute a lag lead filter. In addition, the control voltage VC, with the high frequency component and noise removed, which corresponds to the phase difference is output through the node N2.

The VCO 2, which is an oscillator that controls the frequency of an oscillation signal FV that it outputs based upon the control voltage VC, achieves characteristics whereby, for instance, the frequency of the oscillation signal FV is caused to increase in correspondence to a rise in the control voltage VC. In addition, the feedback circuit 3, which may be constituted of, for instance, a frequency divider, divides the frequency of the oscillation signal FV into 1/n and outputs the divided frequency as the internal signal FI to the PFD 1.

Now, the operation achieved in the PLL in the prior art structured as described above is explained by using an example in which the VCO 2 is set to oscillate over a specific frequency range with the center of the range at 1 MHz and the frequency division ratio at the feedback circuit 3 set at 1/10.

First, when the power is turned on at the PLL, a reference signal FR with its frequency at, for instance, 100 kHz is provided from the outside.

Immediately after the power up, when the capacitor 16 at the LPF 10 has not yet been charged, the control voltage VC output by the LPF 10 is low and the frequency of the oscillation signal FV output by the VCO 2 is lower than 1 MHz. Consequently, the frequency of the internal signal FI output by the feedback circuit 3 is lower than 100 kHz, causing the phase of the internal signal FI to be retarded relative to the phase of the reference signal FR, which results in a detection signal UP at "L" output from the PFD 1. This detection signal UP at "L" turns on the PMOS 11, thereby causing a current to flow from the source potential VDD into the capacitor 16 via the PMOS 11, the resistor 14 and the resistor 15 to charge the capacitor 16. As a result, the control voltage VC output through the node N2 of the LPF 10 rises.

The rise in the control voltage VC causes the frequency of the oscillation signal FV output by the VCO 2 to increase. Then, when the oscillation signal FV achieves a frequency of 1 MHz and the frequency of the internal signal FI reaches 100 kHz to achieve a phase lock, the levels of the detection signals UP and DN output by the PFD 1 are both set to "H." This causes the LPF 10 to stop the rise of the control voltage VC that it outputs to hold the control voltage VC at a constant value. Thus, the frequency of the oscillation signal FV output by the VCO 2 is fixed at 1 MHz.

In this PLL, if, for instance, a fluctuation in the source voltage causes the phase of the internal signal FI to advance relative to the phase of the reference signal FR, the PFD 1 outputs a detection signal DN with its level set to "L" to turn on the NMOS 13 at the LPF 10. When the NMOS 13 is turned on, the electrical charge stored at the capacitor 16 is discharged to the ground potential GND via the resistors 15 and 14 and the NMOS 13, resulting in a fall in the control voltage VC output through the node N2 of the LPF 10. This fall in the control voltage VC causes the frequency of the oscillation signal FV output by the VCO 2 and the frequency of the internal signal FI output by the feedback circuit 3 to decrease as well. As a result, the phase of the internal signal FI is retarded until there is no phase difference relative to the phase of the reference signal FR.

If, on the other hand, the phase of the internal signal F1 is retarded relative to the phase of the reference signal FR, the PFD 1 outputs a detection signal UP with its level set to "L" to raise the control voltage VC output from the LPF 10. This rise in the control voltage VC causes the frequency of the oscillation signal FV output by the VCO 2 and the frequency of the internal signal FI output by the feedback circuit 3 to increase as well. As a result, the phase of the internal signal FI advances until there is no phase difference relative to the phase of the reference signal FR.

As explained above, the PLL in the prior art is structured so that it engages in operation during which the phase of the internal signal FI is made to conform to the phase of the reference signal FR through feedback control.

The response characteristics of the LPF 10, which generates the control voltage VC based upon the detection signals UP and DN greatly affect the operating characteristics of the PLL. Namely, while setting the time constant at the lag lead filter constituted of the resistors 14 and 15 and the capacitor 16 at a large value results in an increase in the length of time elapsing until the phase lock is achieved (the lockup time), the phase jitter, caused by noise and the like, is minimized once the phase lock is achieved. If the time constant at the lag lead filter is set at a small value, on the other hand, the lockup time is reduced, but the phase jitter due to noise and the like increases.

A PLL that includes an LPF having a time constant set at a large value is employed in, for instance, a clock reproduction circuit to reduce phase jitter in the prior art. In addition, a PLL that includes an LPF having a small time constant is employed in frequency synthesizers utilized for transmission/reception frequency control of mobile telephones and the like in order to improve the response speed.

However, the PLL in the prior art poses problems (i)–(iii) detailed below.

(i) In a configuration in which the PFD 1, the LPF 10, the VCO 2 and the feedback circuit 3 constituting the PLL are formed as a single integrated circuit on a semiconductor chip, it is difficult to achieve accuracy with regard to the resistance values at the resistors 14 and 15 and the capacitance value at the capacitor 16 of the LPF 10. In particular, if an extremely fine wiring pattern is used in an integrated circuit such as a CMOS, the values are affected by inconsistency occurring in the manufacturing process to a greater degree, which makes it more difficult to achieve the designed time constant and, therefore, more difficult to achieve the desired characteristics.

(ii) While it is necessary to set the resistance value at the resistor 14 to a large value if an LPF 10 having a large time constant is required, it is difficult to form a resistor achieving a high level of resistance of, for instance, 100 kΩ in a stable manner in an integrated circuit such as a CMOS.

(iii) When a PLL, including the LPF 10, is formed as a single integrated circuit on a semiconductor chip, the characteristics of the LPF 10 cannot be varied in the prior art. For this reason, a multipurpose PLL employed in various applications requires the LPF 10 to be formed on a separate chip as an external circuit, which presents a hindrance to miniaturization of the PLL.

SUMMARY OF THE INVENTION

An object of the present invention, which has been completed by addressing the problems of the prior art discussed above, is to provide a PLL that can be formed as a single unit including an LPF achieving good characteristics on one semiconductor chip.

In order to achieve the object described above, in a first aspect of the present invention, a PLL comprising a PFD formed on a semiconductor substrate that detects the difference between the phases of a reference signal and an internal signal and outputs a first detection signal or a second detection signal in conformance to whether the phase of the internal signal is retarded or advanced, a VCO that outputs an oscillation signal having a frequency corresponding to an applied control voltage, a feedback circuit that generates the internal signal based upon the oscillation signal and provides the internal signal to the PFD and a filter circuit that generates the control voltage for controlling the frequency of the VCO signal and outputs the control voltage through an output node is provided.

The filter circuit is provided with a first means for switching that implements ON/OFF control of the electrical connection between a first source potential and a first node based upon the first detection signal, a first transistor provided between the output node and the first node, whose on resistance is controlled by a first bias voltage supplied to a control electrode thereof, a second transistor provided between a second node and the output node, whose on resistance is controlled by a second bias voltage supplied to a control electrode thereof, a second means for switching that implements ON/OFF control of the electrical connection between a second source potential and the second node based upon the second detection signal and a means for voltage division having a first resistance portion and a second resistance portion, that divides the voltage between the first source potential and the second potential at the first resistance portion and the second resistance portion to generate the second bias voltage.

The filter circuit is further provided with a means for bias generation located between the first source potential and the second source potential that controls an input current with the second bias voltage and generates the first bias voltage based upon the input current (e.g., the means for bias generation may be provided with a transistor that controls the flow of current in correspondence to the second bias voltage to generate the first bias voltage based upon the current flowing through the transistor) and a capacitive means located between the output node and the first source potential or between the output node and the second source potential, that suppresses fluctuation of the control voltage by holding a voltage corresponding to the control voltage.

In a second aspect of the present invention, a PLL that includes a filter circuit having a means for resistance which is connected in series with the capacitive means and restricts the current input to the capacitive means and the current output from the capacitive means is provided.

In a third aspect of the present invention, a PLL that includes a filter circuit having a third transistor connected in parallel to the first transistor and a fourth transistor connected in parallel to the second transistor is provided.

It is desirable that in this PLL, either the first transistor or the third transistor is selected by a first selection signal and is set in an on state and that either the second transistor or the fourth transistor is selected by the first selection signal and is set in an on state. In addition, the first transistor and the third transistor have characteristics that are different from each other, and the characteristics of the second transistor should be different from the characteristics of the fourth transistor. Alternatively, a PLL that includes a filter circuit having a first transistor group constituted of a plurality of transistors connected in parallel to the first transistor and connected in parallel to each other and a second transistor group constituted of a plurality of transistors connected in parallel to the second transistor and connected in parallel to each other is provided.

It is desirable that either the first transistor or one of the plurality of transistors constituting the first transistor group is selected by a first selection signal and is set in an on state and that either the second transistor or one of the plurality of transistors constituting the second transistor group is selected by the first selection signal and is set in an on state. In addition, it is desirable that the characteristics of the first transistor and the characteristics of the individual transistors constituting the first transistor group are different from each other, and that the second transistor and the individual transistors constituting the second transistor group have characteristics that are different from each other.

In a fourth aspect of the present invention, a PLL that includes a filter circuit having a first resistance adjustment portion that selects one or more serial resistors among a plurality of serial resistors connected in series and constituting the second resistor to adjust the resistance value at the second resistor is provided. In addition, the first resistance adjustment portion should preferably be constituted of a first shorting portion that selects one or more serial resistors among the plurality of serial resistors at the second resistor based upon a second selection signal and shorts the one serial resistor or the plurality of serial resistors thus selected.

In a fifth aspect of the present invention, a PLL that includes a filter circuit having a second resistance adjustment portion that selects one or more serial resistors among a plurality of serial resistors connected in series and constituting the means for resistance to adjust the resistance value at the means for resistance is provided. In addition, the second resistance adjustment portion should preferably be constituted of a second shorting portion that selects one or more serial resistors among the plurality of serial resistors at the means for resistance based upon a third selection signal and the one serial resistor or the plurality of serial resistors thus selected.

In a sixth aspect of the present invention, a PLL that includes a filter circuit having a capacitance adjustment portion that selects one or more capacitors among a plurality of capacitors constituting the capacitative means to adjust the capacitance of the capacitive means is provided. It is desirable that the capacitance adjustment portion is provided with a first switching portion that selects one or more capacitors among the plurality of capacitors at the capacitive means based upon a fourth selection signal and applies a voltage corresponding to the control voltage to the one or to the plurality of capacitors that are selected. Furthermore, the individual capacitors at the capacitive means should preferably have different capacities from each other and be connected in parallel to each other.

In a seventh aspect of the present invention, a PLL that includes a filter circuit having a second switching portion that is controlled by a power control signal and is employed to electrically disconnect the means for voltage division from the first source potential and the second source potential is provided.

The PLL according to the present invention structured as described above functions as follows.

A reference voltage is generated by the means for voltage division provided at the filter circuit, and this reference voltage is supplied to the means for bias generation where the first bias voltage and the second bias voltage are generated. The first bias voltage and the second bias voltage are respectively supplied to the control electrode of the first transistor and the control electrode of the second transistor to control the on resistance at the first transistor and the on resistance at the second transistor.

For instance, if the phase of the internal signal fed back from the VCO via the feedback circuit is retarded relative to the phase of the reference signal, the first detection signal is output by the PFD. This first detection signal turns on the first means for switching at the filter circuit, which causes a current to flow from the first source potential into the capacitive means via the first transistor, the output node and the means for resistance to result in an electrical charge stored at the capacitive means. Then, the control voltage output through the output node at the filter circuit rises, which, in turn, causes an increase in the frequency of the oscillation signal output by the VCO and in increase in the frequency of the internal signal output by the feedback circuit. As a result, the phase of the internal signal is made to conform to the phase of the reference signal.

If, on the other hand, the phase of the internal signal fed back from the VCO via the feedback circuit is advanced relative to the phase of the reference signal, the second section signal is output by the PFD. This second detection signal turns on the second means for switching at the filter circuit, which causes a current to flow out of the capacitive means to the second source potential (e.g., the ground potential) via the means for resistance and the second transistor to result in the electrical charge at the capacitative means to become discharged. Thus, the level of the control voltage output through the output node at the filter circuit goes down, which, in turn, causes a decrease in the frequency of the oscillation signal output by the VCO and a decrease in the frequency on the internal signal output by the feedback circuit. As a result, the phase of the internal signal is made to match the phase of the reference signal.

As described above, in the PLL according to the present invention, the phase of the internal signal can be made to conform to the phase of the reference signal through feedback control. In addition, through the PLL according to the present invention, which is provided with a filter circuit having a second switching portion that electrically disconnects the means for voltage division from the first source potential and the second source potential, power saving in a non-operating state is achieved and at the same time, it becomes possible to detect errors through current tests connected in a stationary [resting] state.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Following is a detailed explanation of the preferred embodiments of the PLL according to the present invention, given in reference to the attached drawings. It is to be noted that in the following explanation and the attached drawings, the same reference numbers are assigned to components having essentially identical functions and structural features to preclude the necessity for a repeated explanation thereof.

First Embodiment

Figure 1:
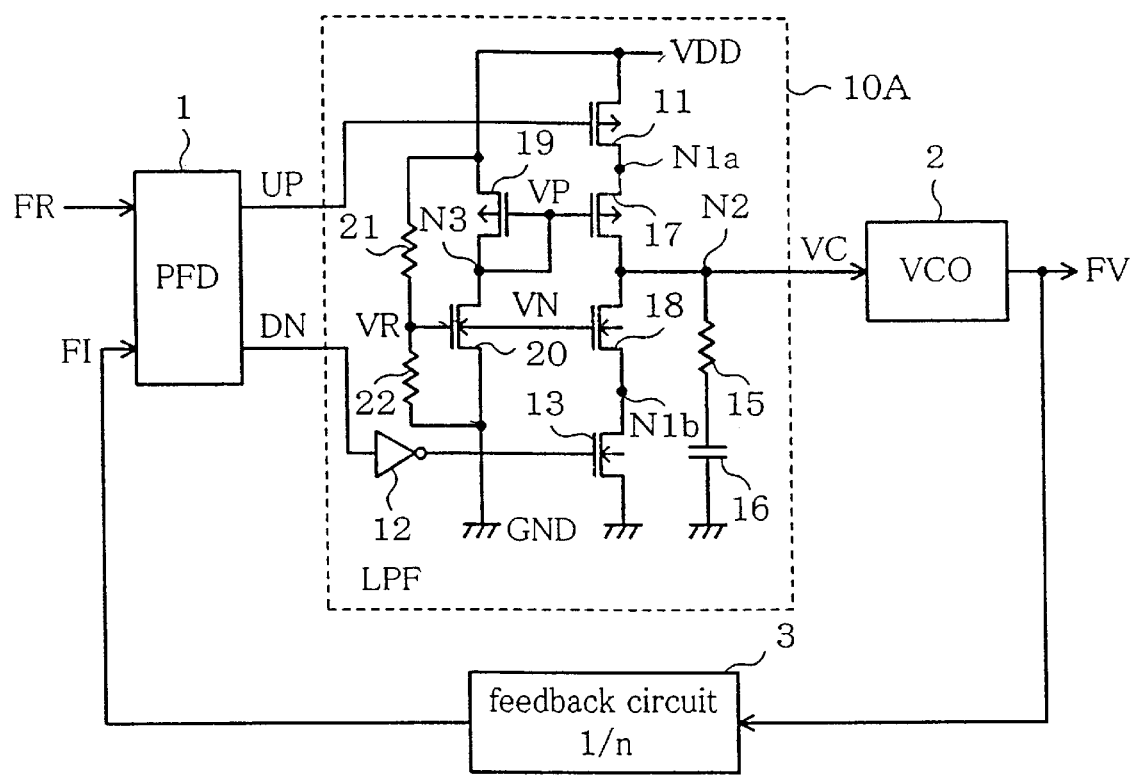
FIG. 1 is a block diagram of the PLL in a first embodiment of the present invention.

FIG. 1 shows the structure of the PLL in the first embodiment of the present invention.

This PLL is formed on a semiconductor chip. It comprises a PFD 1, a VCO 2, a feedback circuit 3 and a filter circuit (e.g., an LPF) 10A. The PFD 1 detects the difference between the phase of a reference signal FR provided from the outside and the phase of an internal signal FI provided by the feedback circuit 3. The PFD 1 outputs a detection signal UP with its level set to "L" by the extent corresponding to the length of time representing the phase difference if the phase of the internal signal FI is retarded relative to the phase of the reference signal FR, outputs a detection signal DN with its level set to "L" by the extent corresponding to the length of time representing the phase difference if the phase of the internal signal FI is advanced relative to the phase of the reference signal FR and outputs detection signals UP and DN with their levels set to "H" if there is no phase difference.

The VCO 2 is an oscillator that controls the frequency of an oscillation signal FV which it outputs in correspondence to a control voltage VC supplied by the LPF 10A, and raises the frequency of the oscillation signal FV in conformance to an increase in the control voltage VC.

The feedback circuit 3, which may be constituted of, for instance, a frequency divider, divides the frequency of the oscillation signal FV by n and provides the signal thus divided to the PFD 1 as the internal signal FI.

The LPF 10A suppresses the high frequency components in the detection signals UP and DN and generates a stable control voltage VC which corresponds to the phase difference between the detection signal UP and the detection signal DN. The LPF 10A is provided with a first means for switching (e.g., a PMOS) 11 connected between a source potential VDD and a node N1a, whose ON/OFF state is controlled by the detection signal UP provided by the PFD 1. In addition, the LPF 10A is provided with an inverter 12 that inverts the level of the detection signal DN and a second means for switching (e.g., and NMOS) 13 connected between a ground potential GND and a node N1b, whose ON/OFF state is controlled by an output signal from the inverter 12. The source of a first transistor (e.g., a PMOS) 17 is connected to the node N1a. The drain of the PMOS 17 is connected to an output node (e.g., a node N2), and the gate of the PMOS 17 is connected to a node N3. The source of a second transistor (e.g., an NMOS) 18 is connected to the node N1b. The drain of the NMOS 18 is connected to the output node (e.g., the node N2).

In addition, the LPF 10A is provided with a means for bias generation (e.g., a PMOS 19 and an NMOS 20) and a means for voltage division (e.g., resistors 21 and 22).

The source of the PMOS 19 is connected to the source potential VDD, with the drain and the gate of the PMOS 19 connected to the node N3. The drain of the NMOS 20 is connected to the node N3, with the source of the NMOS 20 connected to the ground potential GND.

The resistors 21 and 22 are connected in series between the source potential VDD and the ground potential GND. The reference voltage VR generated through voltage division achieved at the resistors 21 and 22 is commonly applied to the gates of the NMOSs 20 and 18.

As described above, the PMOS 17 and the NMOS 18, together with the PMOS 19 and the NMOS 20, constitute a current mirror circuit. Bias voltages VP and VN are respectively applied to the gates of the PMOS 17 and the NMOS 18.

A means for resistance (e.g., a resistor) 15 and a capacitative means (e.g., a capacitor) 16 which are connected in series are connected between the node N2 and the ground potential GND.

Figure 2:
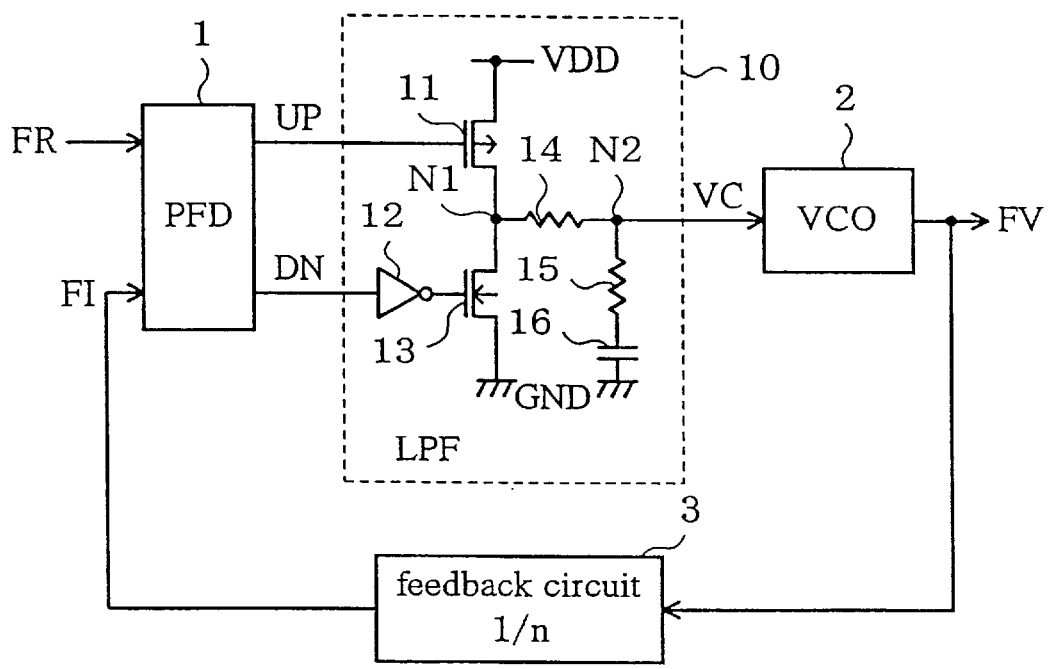
FIG. 2 is a block diagram of a PLL in the prior art.

The PMOS 17 and the NMOS 18 correspond to the resistor 14 at the LPF 10 constituting the PLL in the prior art illustrated in FIG. 2. A lag lead filter is constituted by the on resistance at the PMOS 17 or the NMOS 18, the resistor 15 and the capacitor 16. This lag lead filter removes the high frequency components and noise in the detection signals UP and DN so that a control voltage VC corresponding to the phase difference is output through the node N2.

The operation achieved at the PLL in the first embodiment structured as described above is now explained by using an example in which the VCO 2 is set to oscillate within a specific frequency range with the center of the range at 10 MHz and the frequency division ratio at the feedback circuit 3 is set at 1/100.

First, when the power is turned on at the PLL, a reference signal FR having a frequency of, for instance, 100 kHz is provided from the outside. The source potential VDD is divided at the resistors 21 and 22 and the reference voltage VR generated at the resistors 21 and 22 is supplied to the gate of the NMOS 20. Thus, a specific current corresponding to the reference voltage VR flows through the PMOS 19 and the NMOS 20.

Immediately after the power up, when the capacitor 16 at the LPF 10A has not been charged yet, the level of the control voltage VC output by the LPF 10A is low, resulting in the frequency of the oscillation signal FV output by the VCO 2 being lower than 10 MHz. As a result, the frequency of the internal signal FI output by the feedback circuit 3 is lower than 100 kHz, which causes the phase of the internal signal FI to be retarded relative to the phase of the reference signal FR. While the phase retardation of the internal signal FI is being detected, the PFD 1 outputs a detection signal UP with its level set to "L." This detection signal UP at "L" turns on the PMOS 11. At the same time, the level of the detection signal DN is set to "H" and therefore, the NMOS 13 remains in an off state.

As the PMOS 11 is turned on, a specific level of an electrical current, which conforms to the bias voltage VP applied to the gate of the PMOS 17 flows through the PMOS 17, thereby enabling the PMOS 17 to function as a resistor having a specific on resistance. Then, a current flows into the capacitor 16 from the source potential VDD via the PMOS 11, the PMOS 17 and the resistor 15, to charge the capacitor 16, thereby causing the control voltage VC output through the node N2 at the LPF 10A to rise.

The rise in the control voltage VC causes an increase in the frequency of the oscillation signal FV output by the VCO 2. When the frequency of the oscillation signal FV reaches 10 MHz and the frequency of the internal signal Fl reaches 100 kHz to achieve a phase lock, the levels of the detection signals UP and DN output by the PFD 1 are both set to "H." This turns off both the PMOS 11 and the NMOS 13, and the LPF 10 halts the rise in the control voltage VC that it outputs and holds the level of the control voltage VC at a constant value. Thus, the frequency of the oscillation signal FV output by the VCO 2 is fixed at 10 MHz.

In this PLL, if a source voltage fluctuation, for instance, causes the phase of the internal signal FI to advance relative to the phase of the reference signal FR, the PFD 1 outputs a detection signal DN with its level set to "L" to turn on the NMOS 13 at the LPF 10A. As the NMOS 13 is turned on, a specific level of electrical current conforming to the bias voltage VN that is supplied to the gate of the NMOS 18 flows through the NMOS 18, thereby enabling the NMOS 18 to function as a resistor having a specific on resistance. Then, the electrical charge stored at the capacitor 16 is discharged to the ground potential GND via the resistor 15 and the NMOSs 18 and 13, causing a fall in the control voltage VC output through the node N2 at the LPF 10A. As the level of the control voltage VC falls, the frequency of the oscillation signal FV output by the VCO 2 and the frequency of the internal signal FI output by the feedback circuit 3 also become lower. As a result, the phase of the internal signal FI is retarded until there is no phase difference relative to that of the reference signal FR.

If, on the other hand, the phase of the internal signal FI becomes retarded relative to the phase of the reference signal FR, a detection signal UP with its level set to "L" is output by the PFD 1, causing a rise in the control voltage VC output by the LPF 10A. As the level of the control voltage VC rises, the frequency of the oscillation signal FV output by the VCO 2 and the frequency of the internal signal FI output by the feedback circuit 3 also become higher. As a result, the phase of the internal signal FI advances until there is no phase difference relative to that of the reference signal FR.

As described above, the PLL in the first embodiment achieves the following advantages (1)~(3).

(1) The on resistances at the PMOS 17 and the NMOS 18 are used as the resistance components of the lag lead filter which constitutes part of the LPF 10A. The on resistances at the PMOS 17 and the NMOS 18 are controlled by the bias voltages VP and VN supplied by the current mirror circuit. In such a structure, a high level of resistance can be produced easily, even when the PLL unit formed on a semiconductor chip and the time constant at the LPF 10A can be set at a large value.

(2) The bias voltages VP and VN at the current mirror circuit are determined based upon the reference voltage VR generated at the voltage dividing circuit comprising the resistors 21 and 22. Since the ratio of voltage division achieved by the resistors 21 and 22 is hardly affected by any inconsistency occurring during the process of manufacturing semiconductor chips, the PLL characteristics are stable.

(3) Since the LPF 10A can be formed together with the PFD 1 and the feedback circuit 3 on a single semiconductor chip, miniaturization of the PLL is achieved.

Second Embodiment

The PLL in the second embodiment of the present invention is now explained. The PLL in the second embodiment assumes a structure achieved by replacing the LPF 10A in the PLL in the first embodiment with an LPF 10B.

Figure 3:
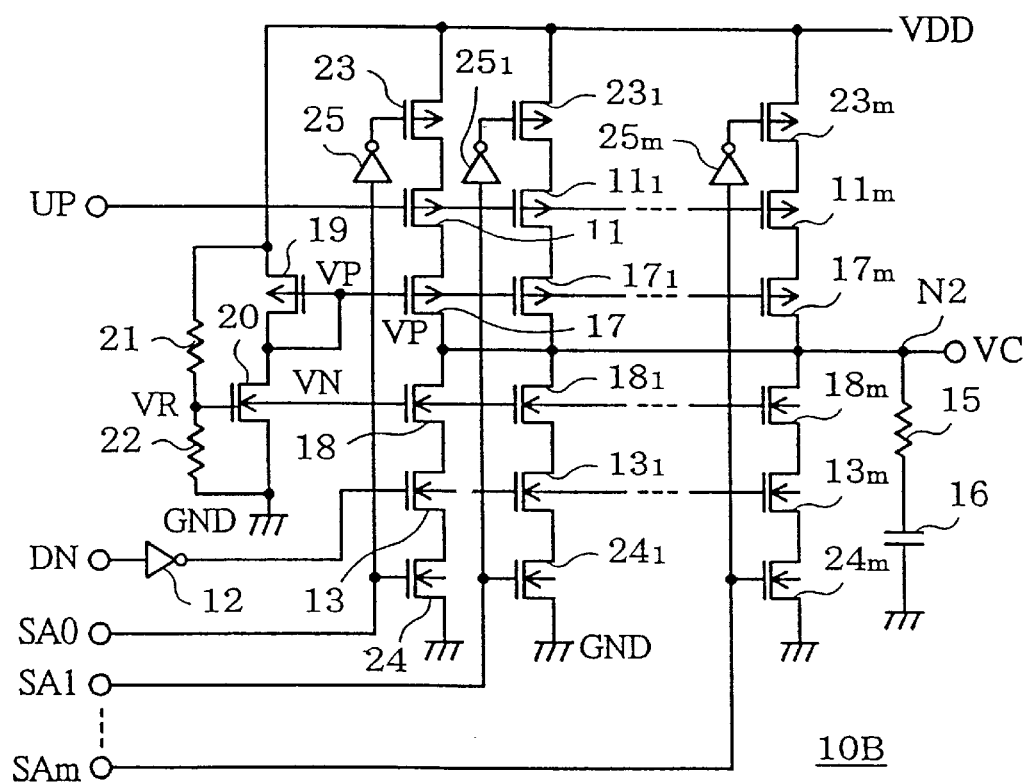
FIG. 3 is a circuit diagram of the LPF provided in the PLL in a second embodiment of the present invention.

FIG. 3 illustrates the circuit structure of the LPF 10B provided in the PLL in the second embodiment.

The LPF 10B is provided with a PMOS 23 for switching located between the source of the PMOS 11 and the source potential VDD and an NMOS 24 for switching located between the source of the NMOS 13 and the ground potential GND. A selection signal SA0 is input from the outside to the gate of the NMOS 24 and a signal achieved by inverting the logic of the selection signal SA0 with an inverter 25 is input to the gate of the PMOS 23.

The LPF 10B is further provided with serial circuits each comprising PMOSs 23$i$, 11$i$ and 17$i$ and NMOSs 18$i$, 13$i$ and 24$i$ (i=1~m), that are connected in parallel to the serial circuit comprising the PMOSs 23, 11 and 17 and the NMOSs 18, 13 and 24. In order to differentiate the on resistances at the PMOSs 17$i$ in the individual serial circuits, the gate width and the gate length at each PMOS 17$i$ are set at specific values, and likewise, in order to differentiate the on resistances at the NMOSs 18$i$ in the individual serial circuits, the gate width and the gate length at each NMOS 18$i$ are set at specific values.

The detection signal UP is commonly applied to the gates of the PMOS 11 and the individual PMOSs 11$i$, and the detection signal DN is commonly applied to the gate of the NMOS 13 and the individual NMOSs 13$i$ via the inverter 12. The gates of the PMOS 17 and the individual PMOSs 17$i$ are commonly connected to the gate of the PMOS 19, whereas the gates of the NMOS 18 and the individual NMOSs 18$i$ are commonly connected to the gate of the NMOS 20. In addition, the drains of the individual PMOSs 17$i$ and the individual NMOSs 18$i$ are commonly connected to the node N2. External selection signals SAi are input to the gates of the NMOSs 24$i$ and signals achieved through logic inversion performed on the selection signal SA0 with inverters 25$i$ are input to the gates of the PMOSs 23$i$.

When one of the signals among the selection signals SA0 and the selection signals SAi is set to "H" and the levels of all the other signals are set to "L," the serial circuit provided with the selection signal SA0 or SAi whose level is set to "H" is selected, thereby setting the PMOS 23, the PMOS 23$i$, the NMOS 24 or the NMOS 24$i$ constituting the selected serial circuit in an on state. The other serial circuits that have not been selected are cut off from the source potential VDD and the ground potential GND.

The PLL in the second embodiment structured as described above engages in an operation identical to that achieved by the PLL in the first embodiment illustrated in FIG. 1, with respect to the phase lock of the internal signal FI and the reference signal FR. Furthermore, the PLL in the second embodiment achieves another advantage (4) in addition to the advantages (1)~(3) explained earlier.

(4) Since the on resistances at the PMOSs 17$i$ and at the NMOSs 18$i$ in the individual serial circuits are set to different values, specific characteristics (e.g., a specific time constant) can be selected with ease for the LPF 10B by the external selection signals SAi. It is to be noted that it is also possible to adjust the time constant at the LPF 10B by setting the on resistances at the PMOSs 17$i$ and the NMOSs 18$i$ at the same value and selecting a plurality of serial circuits in combination by the selection signals SAi.

Third Embodiment

The PLL in the third embodiment of the present invention is now explained. The PLL in the third embodiment assumes a structure achieved by replacing the LPF 10A in the PLL in the first embodiment with an LPF 10C.

Figure 4:
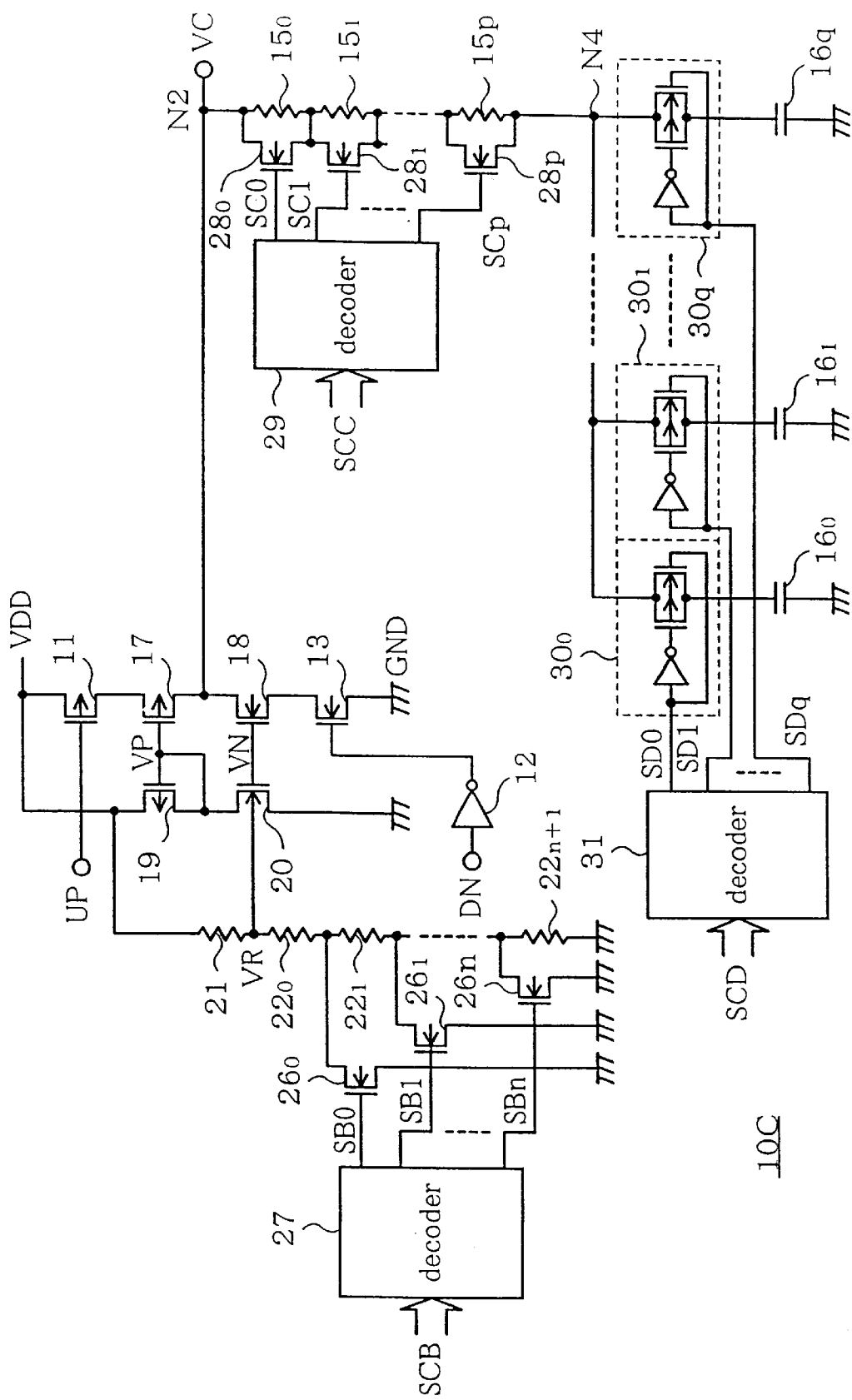
FIG. 4 is a circuit diagram of the LPF provided in the PLL in a third embodiment of the present invention.

FIG. 4 illustrates the circuit structure of the LPF 10C provided in the PLL in the third embodiment.

The LPF 10C is provided with a plurality of serial resistors 220, 221 . . . , 22n+1 that are connected in series, instead of the resistor 22 provided in the LPF 10A illustrated in FIG. 1. In addition, the LPF 10C is provided with first shorting portions (e.g., NMOSs 26$j$ each located between the connection point of a serial resistor 22$j$ and a serial resistor 22$j$+1 (j=0~n) and the ground potential GND, that shorts the serial resistors 22$j$+1~22n+1. The LPF 10C is further provided with a decoder 27. The decoder 27 decodes a binary selection code SCB input from the outside and outputs selection signals SB0, SB1 . . . , SBn. One of the selection signals SB0~SBn is set to "H" and the levels of all the other selection signals are set to "L." The selection signals SB0~SBn are respectively input to the gates of the NMOSs 260~26n to implement ON/OFF control of the NMOSs 260~26n.

The LPF 10C is provided with a plurality of serial resistors 150, 151, . . . , 15p connected in series between the nodes N2 and N4, in place of the resistor 15 in the LPF 10A illustrated in FIG. 1. The individual serial resistors 150, 151, . . . , 15p are formed so that they achieve different resistance values. Each serial resistor 15k (k=0~p) is connected with a second shorting portion (e.g., an NMOS) 28k provided to short the serial resistor 15k at both ends. The gates of the individual NMOSs 28k are connected to the output side of a decoder 29. The decoder 29 implements ON/OFF control of the NMOSs 28k based upon a binary selection code SCC provided from the outside.

The LPF 10C is provided with a plurality of capacitors 160, 161, ..., 16q achieving different capacitances, in place of the capacitor 16 provided in the LPF 10A illustrated in FIG. 1. The individual capacitors 161 (1=0~q) are each connected to the ground potential GND at one end, with the other ends of the capacitors 161 connected to the node N4 via first switching portions (e.g., analog switches) 300, 301, ..., 30q respectively. Control terminals of each analog switch 301 are connected to the output side of a decoder 31. The decoder 31 implements ON/OFF control of the analog switches 301 based upon a binary selection code SCD provided from the outside.

When the selection codes SCB, SCC and SCD are provided from the outside to the LPF 10C structured as described above, the LPF 10C engages in the following operation.

The decoder 27 sets the level of a selection signal SBj corresponding to the selection code SCB alone to "H." Thus, the NMOS 26j is turned on, thereby shorting the serial resistors 22j+1~22n+1.

The decoder 29 sets the level of a selection signal SCk corresponding to the selection code SCC alone to "H." Thus, the NMOS 28k is turned on, thereby shorting the serial resistor 15k.

The decoder 31 sets the level of a selection signal SD1 corresponding to the selection code SCC alone to "H." Thus, the analog switch 301 is turned on, thereby connecting the capacitor 161 to the node N4 and cutting off the other capacitors from the node N4.

The PLL in the third embodiment structured as described above engages in an operation identical to that achieved by the PLL in the first embodiment illustrated in FIG. 1, with respect to the phase lock of the internal signal FI and the reference signal FR. Furthermore, the PLL in the third embodiment achieves further advantages (5)~(8) in addition to the advantages (1)~(3) explained earlier.

(5) The PLL in the third embodiment is provided with the NMOSs 260~26n through which one or more serial resistors among the serial resistors 220~22n+1 connected in series are selected and shorted based upon the external selection code SCB. Thus, in the PLL in the third embodiment, specific characteristics (e.g., a specific time constant) can be selected easily with a high degree of accuracy for the LPF 10C by using the external selection code SCB.

(6) The PLL in the third embodiment is provided with the NMOSs 280~28p employed to select and short one serial resistor among the serial resistors 150~15p connected in series and having different resistance values based upon the external selection code SCC. Thus, in the PLL in the third embodiment, specific characteristics (e.g., a specific time constant) can be selected easily with a high degree of accuracy for the LPF 10C by using the external selection code SCC.

(7) The PLL in the third embodiment is provided with the analog switches 300~30q employed to select one capacitor among the plurality of capacitors 160~16q having different capacitances based upon the external selection code SCD. Thus, in the PLL in the third embodiment, specific characteristics (e.g., a specific time constant) can be selected easily with a high degree of accuracy for the LPF 10C by using the external selection code SCD.

(8) The PLL in the third embodiment is provided with the decoders 27, 29 and 31 that respectively decode the binary selection codes SCB, SCC and SCD provided from the outside and output corresponding selection signals SBj, SCk and SDl. Consequently, in the PLL in the third embodiment, the number of terminals for external connection can be reduced compared to a structure in which the selection signals SBj, SCk and SDl are directly input from the outside.

Fourth Embodiment

The PLL in the fourth embodiment of the present invention is now explained. The PLL in the fourth embodiment assumes a structure achieved by replacing the LPF 10A in the PLL in the first embodiment with an LPF 10D.

Figure 5:
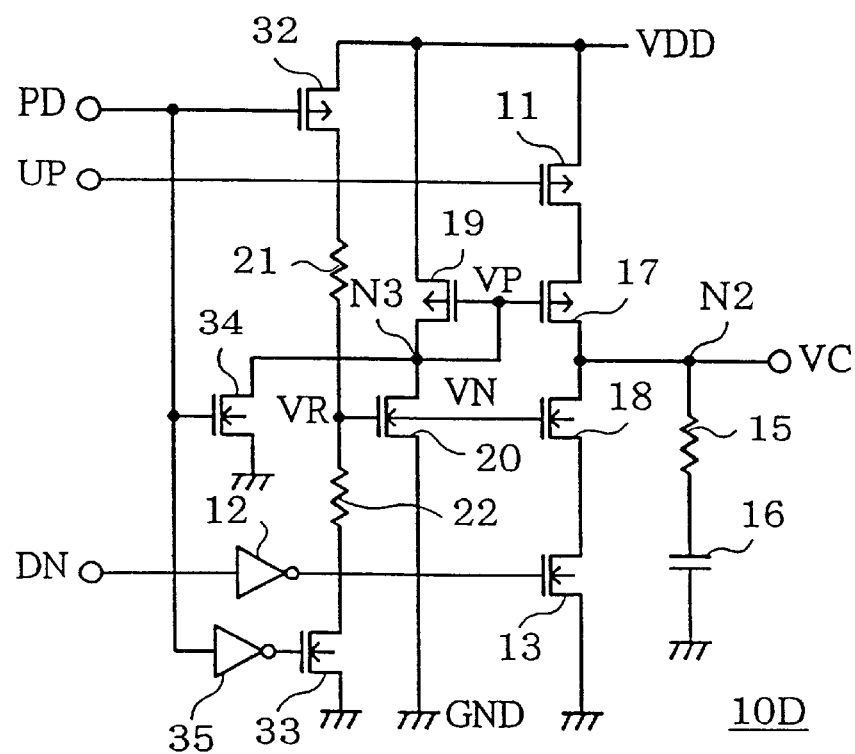
FIG. 5 is a circuit diagram of the LPF provided in the PLL in a fourth embodiment of the present invention.

FIG. 5 illustrates the circuit structure of the LPF 10D provided in the PLL in the fourth embodiment.

The LPF 10D is provided with a PMOS 32 for switching located between the resistor 21 and the source potential VDD, an NMOS 33 for switching located between the resistor 22 and the ground potential GND and an NMOS 34 for switching located between the node N3 and the ground potential GND. An external power down control signal PD is input to the gates of the PMOS 32 and NMOS 34, whereas a signal achieved by performing logic inversion on the power down control signal PD with an inverter 35 is input to the gate of the NMOS 33. It is to be noted that the other structural features of the LPF 10D are essentially identical to those of the LPF 10A in FIG. 1.

In the LPF 10D, as the external power down control signal PD is set to "H," the PMOS 32 and the NMOS 33 are turned off, and the resistors 21 and 22 are electrically cut off from the source potential VDD and the ground potential GND. In addition, the NMOS 34 is turned on, thereby electrically connecting the node N3 with the ground potential GND.

When the power down control signal PD shifts to "L," on the other hand, the PMOS 32 and the NMOS 33 are turned on, and the NMOS 34 is turned off. By turning on the PMOS 32 and the NMOS 33, the electrical current flowing from the source potential VDD to the ground potential GND is caused to flow through the resistors 21 and 22, the reference voltage VR is output at the connection point of the resistors 21 and 22 and the bias voltage VN is applied to the current mirror circuit. In addition, by turning off the NMOS 34, the bias voltage VP is output through the node N3.

The PLL in the fourth embodiment structured as described above engages in an operation identical to that achieved by the PLL in the first embodiment illustrated in FIG. 1, with respect to the phase lock of the internal signal FI and the reference signal FR when the power down control signal PD is set to "L". Furthermore, the PLL in the fourth embodiment achieves another advantage (9) in addition to the advantages (1)~(3) explained earlier.

(9) In the PLL in the fourth embodiment, the resistors 21 and 22 are cut off from the source potential VDD and the ground potential GND by setting the level of the power down control signal PD to "H." Thus, it is possible to reduce the power consumption in, for instance, a non-operating state. In addition, an Iddq test (stationary state current test) can be conducted to detect an error in the PLL by using the current value in a non-operating state.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

(a)~(k) below may be adopted, for instance, as other embodiments of the present invention.

(a) While the PFD1 provided in the PLLs in the embodiments of the present invention outputs a detection signal UP or DN whose level is set to "L" when a phase difference between the reference signal FR and the internal signal FI is detected, a PFD that outputs a detection signal UP or DN whose level is set to "H" may be employed in place of the PFD1. In such a case, it is desirable to reconnect the inverter 12, which is connected to the detection signal DN in the embodiments, to the detection signal UP.

(b) While the VCO2 provided in the PLLs in the embodiments of the present invention causes a rise in the frequency of the oscillation signal FV that it outputs as the control voltage VC increases, a VCO that lowers the frequency of the oscillation signal FV that it outputs as the control voltage VC rises may be employed in place of the VCO2. In such a case, by crossing the transmission lines of the detection signals UP and DN between the PFD1 and the LPF10A, for instance, an operation identical to that achieved in the PLL in the embodiments of the present invention is realized.

(c) While the feedback circuit 3 provided in the PLLs in the embodiments of the present invention generates the internal signal FI by performing frequency division on the oscillation signal FV using a divisor of n, a feedback circuit that provides the oscillation signal FV to the PFD1 simply by adjusting its signal level without performing any frequency division may be employed in place of the feedback circuit 3.

(d) While the PFD1, the VCO2, the feedback circuit 3 and the LPF10A, 10B, 10C or 10D may be all formed on a single semiconductor chip, the VCO2 may be mounted externally when, for instance, a VCO2 constituted of a voltage-controlled crystal oscillator circuit is utilized.

(e) While the LPF10A provided in the PLL in the first embodiment illustrated in FIG. 1 assumes a structure achieved by replacing the resistor 14 in the LPF10 of the PLL in the prior art illustrated in FIG. 2 with the on resistances of the PMOS 17 and the NMOS 18, the resistor 15 may be likewise replaced by the on resistances of a PMOS and an NMOS.

(f) While the PMOSs 23 and 23$i$ for switching are inserted on the source potential VDD side in the LPF10B in the PLL in the second embodiment illustrated in FIG. 3, they may instead be inserted between the PMOSs 11 and 11$i$ and the PMOSs 17 and 17$i$. Likewise, the NMOSs 24 and 24$i$ may be inserted between the NMOSs 13 and 13$i$ and the NMOSs 18 and 18$i$.

(g) While the selection signals SA0~SAm are directly input from the outside in the LPF10B provided in the PLL in the second embodiment illustrated in FIG. 3, the selection signals SA0~SAm may be generated by decoding a binary selection code with a decoder as in the LPF10C provided in the PLL in the third embodiment illustrated in FIG. 4.

(h) While all the values at the resistors 22 and 15 and the capacitor 16 can be selected with selection codes input from the outside in the LPF10C provided in the PLL in the third embodiment of the present invention illustrated in FIG. 4, an LPF that allows selection of the values only at the resistors 22 and 15, for instance, may be employed in place of the LPF10C.

(i) While the binary selection codes SCB, SCC and SCD are decoded by the decoders 27, 29 and 31 to generate the selection signals SBj, SCk and SDl in the LPF10C provided in the PLL in the third embodiment illustrated in FIG. 4, the selection signals SBj, SCk and SDl may be directly input from the outside instead. In such a case, a greater variety is achieved in the combinations made in the selection.

(j) A plurality of serial circuits each comprising PMOSs 11$i$ and 17$i$ and NMOSs 13$i$ and 18$i$ may be provided in parallel in the LPF10C provided in the PLL in the third embodiment illustrated in FIG. 4, as in the LPF10B provided in the PLL in the second embodiment illustrated in FIG. 3. In addition, a circuit that implements power down control may be added in the LPF10C, as in the PLL in the fourth embodiment illustrated in FIG. 5.

Figure 6A:
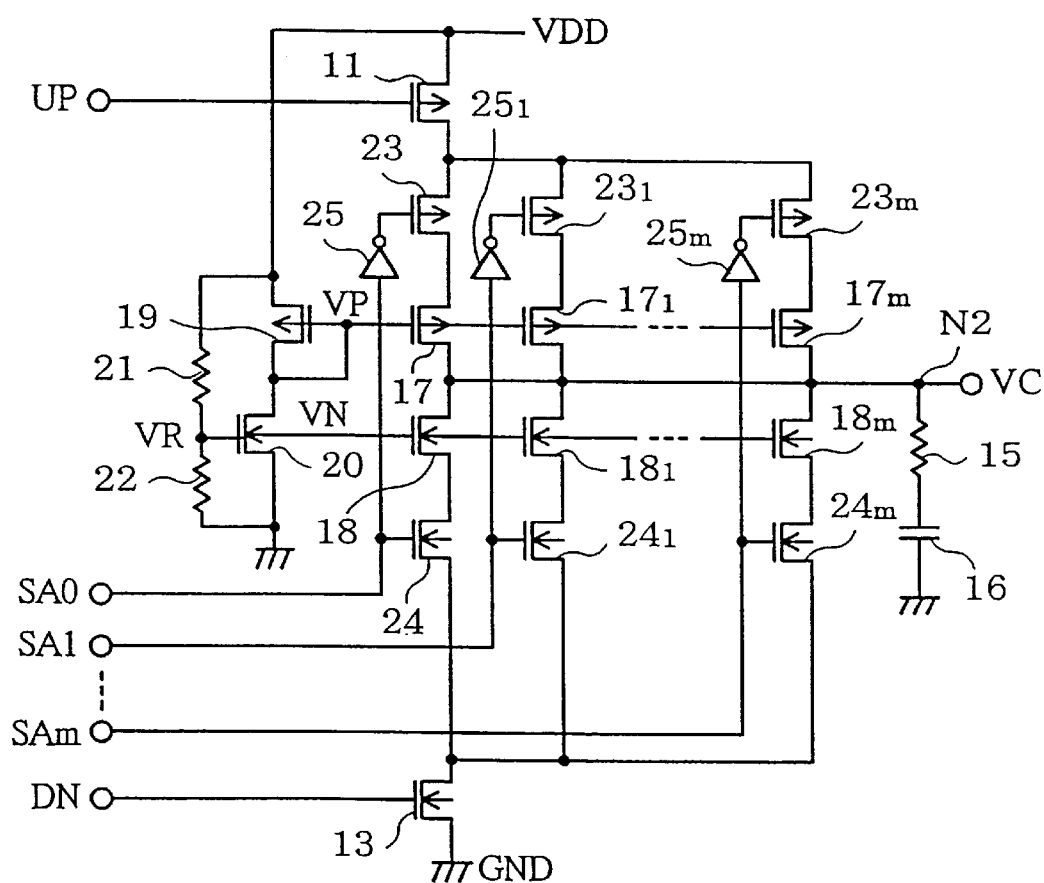
FIG. 6a is a circuit diagram of the LPF provided in the PLL in another embodiment of the present invention.
Figure 6B:
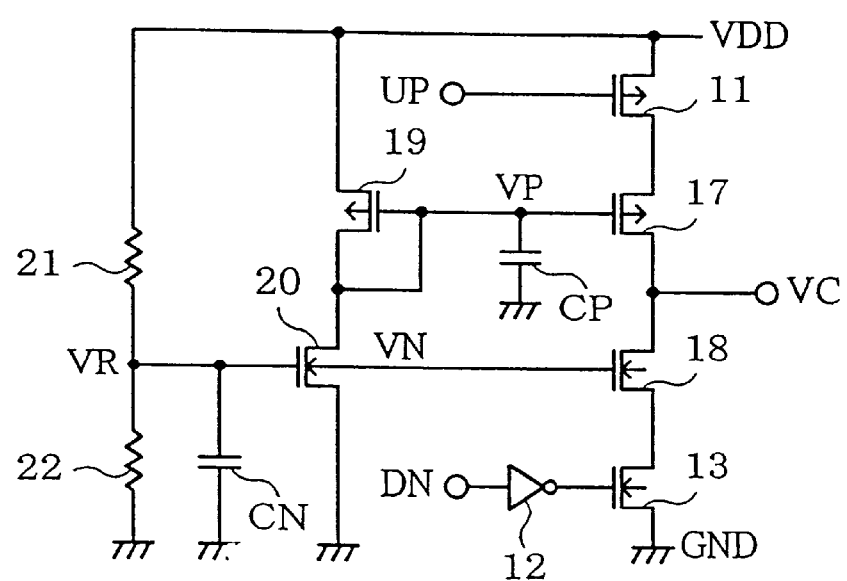
FIG. 6b is a variation of the current mirror circuit.

(k) FIG. 6($a$) illustrates a variation of the LPF provided in the PLL in the second embodiment illustrated in FIG. 3, whereas FIG. 6($b$) illustrates a variation of the current mirror circuit provided in the PLLs in the individual embodiments.

As illustrated in FIG. 6($a$), only a PMOS 11 may be provided to constitute a first means for switching whose ON/OFF state is controlled by the detection signal UP, to electrically connect the source potential VDD with the PMOSs 23, 231, 232, . . . , 23$m$ and the PMOSs 17, 171, 172, . . . , 17$m$ through the PMOS 11. Likewise, only an NMOS S13 may be provided to constitute a second means for switching whose ON/OFF state is controlled by the detection signal DN, to electrically connect the ground potential GND with the NMOSs 24, 241, 242, . . . , 24$m$ and the NMOSs 18, 181, 182, . . . , 18$m$ through the PMOS 11. In addition, as illustrated in FIG. 6($b$), capacitors CP and CN may be inserted in the transmission lines for the bias voltages VP and VN. In this structure, even when source noise occurs, the noise is absorbed by the capacitors CP and CN, thereby preventing fluctuations and the like of the bias voltages VP and VN caused by the noise. Thus, stabilized bias voltages VP and VN are supplied to the transistors PMOS 17 and the NMOS 13.

As has been explained, according to the present invention, the first source potential, the second source potential and the output node are connected through the first transistor controlled by the first bias voltage and the second transistor controlled by the second bias voltage. In addition, a high resistance value can be obtained with ease through the on resistances at the first transistor and the second transistor. Furthermore, the first bias voltage is generated by the means for bias generation which is controlled by the second bias voltage obtained through the means for voltage division. Thus, a very precise resistance can be obtained through the bias voltages.

Since the means for resistance and the capacitative means are connected to the output node, fluctuations of the voltage is minimized to achieve stabilization of the operation.

The first transistor and the second transistor are respectively connected in parallel with the third transistor and the fourth transistor or with the first transistor group and the second transistor group. A transistor is selected by the first selection signal. Consequently, specific characteristics (e.g., a specific time constant) can be selected easily with a high degree of accuracy for the LPF.

According to the present invention, the second resistance portion at the means for voltage division is constituted of a plurality of serial resistors, and one or more serial resistors are selected by the second selection signal. Then, a selected serial resistor is shorted to adjust the resistance value at the second resistance portion. This structure expands the range over which characteristics selection can be made for the LPF.

According to the present invention, means for resistance is constituted of a plurality of serial resistors, and one or more serial resistors are selected by the third selection signal. Then, a selected serial resistor is shorted to adjust the resistance value at the means for resistance. This structure expands the range over which characteristics selection can be made for the LPF.

According to the present invention, the capacitative means is constituted of a plurality of capacitors, and one or more capacitors are selected by the fourth selection signal to adjust the capacitance of the capacitative means. This structure extends the range over which characteristics selection is made for the LPF.

According to the present invention, a second switching portion that cuts off the current flowing into the means for voltage division and the like at the filter circuit is provided. Thus, unnecessary power consumption is prevented and, at the same time, error detection through a stationary state current test is enabled.

The entire disclosure of Japanese Patent Application No. 11-98330 filed on Apr. 6, 1999 including specification, claims, drawings and summary is incorporated herein by reference in its entirety.

What is claimed is:

1. A phase lock loop circuit comprising:
    a phase difference detection circuit, formed on a semiconductor substrate, that detects a difference between the phase of a reference signal and the phase of an internal signal and outputs a first detection signal or a second detection signal in conformance to whether the phase of said internal signal is retarded or advanced;
    a voltage-controlled oscillator circuit that outputs an oscillation signal having a frequency corresponding to a control voltage applied thereto;
    a feedback circuit that generates said internal signal based upon said oscillation signal and provides said internal signal to said phase difference detection circuit; and
    a filter circuit that generates said control voltage and outputs said control voltage through an output node thereof, wherein
    said filter circuit is provided with:
        a first means for switching that implements ON/OFF control of electrical connection between a first source potential and a first node based upon said first detection signal;
        a first transistor located between said output node and said first node, and whose on resistance is controlled by a first bias voltage supplied to a control electrode thereof;
        a second transistor located between a second node and said output node, and whose on resistance is controlled by a second bias voltage supplied to a control electrode thereof;
        a second means for switching that implements ON/OFF control of electrical connection between a second source potential and said second node based upon said second detection signal;
        a means for voltage division that includes a first resistance portion and a second resistance portion, and that divides the voltage between said first source potential and said second source potential at said first resistance portion and said second resistance portion to generate said second bias voltage;
        a means for bias generation, located between said first source potential and said second source potential, that controls a current input thereto with said second bias voltage, and generates said first bias voltage based upon the current input thereto; and
        a capacitive means, located between said output node and said second source potential, that prevents fluctuation of said control voltage by holding a voltage corresponding to said control voltage.

2. A phase lock loop circuit according to claim 1, wherein:
    said filter circuit is further provided with
        a means for resistance that is connected in series with said capacitive means, and that restricts current input to said capacitative means and current output from said capacitive means.

3. A phase lock loop circuit according to claim 1, wherein:
    said filter circuit is further provided with:
        a third transistor connected in parallel with said first transistor; and
        a fourth transistor connected in parallel with said second transistor.

4. A phase lock loop circuit according to claim 3, wherein:
    either said first transistor or said third transistor is selected and set in an on state by a first selection signal; and
    either said second transistor or said fourth transistor is selected and set in an on state by said first selection signal.

5. A phase lock loop circuit according to claim 3, wherein:
    characteristics of said first transistor are different from characteristics of said third transistor; and
    characteristics of said second transistor are different from characteristics of said fourth transistor.

6. A phase lock loop circuit according to claim 1, wherein:
    said filter circuit is further provided with:
        a first transistor group, constituted of a plurality of transistors connected in parallel with each other, that is connected in parallel with said first transistor; and
        a second transistor group, constituted of a plurality of transistors connected in parallel with each other, that is connected in parallel with said second transistor.

7. A phase lock loop circuit according to claim 6, wherein:
    one transistor among said first transistor and said plurality of transistors constituting said first transistor group is selected and set in an on state by a first selection signal; and
    one transistor among said second transistor and said plurality of transistors constituting said second transistor group is selected and set in an on state by said first selection signal.

8. A phase lock loop circuit according to claim 6, wherein:
    characteristics of said first transistor are different from characteristics of individual transistors constituting said first transistor group; and
    characteristics of said second transistor are different from characteristics of individual transistors constituting said second transistor group.

9. A phase lock loop circuit according to claim 1, wherein:
    said filter circuit is further provided with
        a first resistance adjustment portion that selects one or more serial resistors among a plurality of serial resistors connected in series, and constituting said second resistance portion, to adjust the resistance value of said second resistance portion.

10. A phase lock loop circuit according to claim 9, wherein:
    said first resistance adjustment portion is constituted of a first shorting portion that selects one or more serial resistors among said plurality of serial resistors constituting said second resistance portion based upon a selection signal and shorts one or more serial resistors thus selected.

11. A phase lock loop circuit according to claim 2, wherein:
    said filter circuit is further provided with
        a resistance adjustment portion that selects one or more serial resistors among a plurality of serial resistors connected in series, and constituting said means for resistance, to adjust the resistance value at said means for resistance.

12. A phase lock loop circuit according to claim 11, wherein:
said resistance adjustment portion is constituted of a shorting portion that selects one or more serial resistors among said plurality of serial resistors constituting said means for resistance based upon a selection signal and shorts one or more serial resistors thus selected.

13. A phase lock loop circuit according to claim 1, wherein:
said filter circuit is further provided with
a capacitance adjustment portion that selects one or more capacitors among a plurality of capacitors constituting said capacitive means, to adjust the capacitance of said capacitive means.

14. A phase lock loop circuit according to claim 13, wherein:
said capacitance adjustment portion is provided with a first switching portion that selects one or more capacitors among said plurality of capacitors constituting said capacitive means based upon a selection signal and applies a voltage corresponding to said control voltage to the one or more capacitors thus selected.

15. A phase lock loop circuit according to claim 13, wherein:
said capacitors constituting said capacitive means have different capacitances and are connected in parallel to each other.

16. A phase lock loop circuit according to claim 1, wherein:
said filter circuit is further provided with
a switching portion that is controlled by a power control signal and employed to electrically disconnect said means for voltage division from said first source potential and said second source potential.

17. A phase lock loop circuit according to claim 1 wherein said filter circuit further comprises: a series connection of a third transistor and a third means for switching connected in parallel with the series connection of the first means for switching and said first transistor; and a series connection of a fourth means for switching and a fourth transistor connected in parallel with the series connection of said second means for switching and said second transistor; said third and fourth transistors have control electrodes that are connected to the control electrodes of said first and second transistors, respectively; and said third and fourth means for switching are controlled by said first and second detection signals, respectively.

18. A phase lock loop circuit according to claim 17 wherein said filter circuit further comprises: further normally off means for switching connected in each of said series connections, and responsive to a selection signal, for either selecting and connecting the series connection containing said first transistor and the series circuit containing said second transistor to said first source potential and said second source potential, respectively, or selecting and connecting the series connection containing said third transistor and the series connection containing said fourth transistor to said first source potential and said second source potential, respectively.

19. A phase lock loop circuit according to claim 1 wherein said first transistor and said third transistor are of one conductivity type, and said second transistor and said fourth transistor are of another conductivity type.

* * * * *